(12) United States Patent
Hu et al.

(10) Patent No.: US 9,942,980 B2
(45) Date of Patent: Apr. 10, 2018

(54) WAVY INTERCONNECT FOR BENDABLE AND STRETCHABLE DEVICES

(71) Applicant: INTEL CORPORATION, Santa Clara, CA (US)

(72) Inventors: Chuan Hu, Chandler, AZ (US); Adel A. Elsherbini, Chandler, AZ (US); Yoshihiro Tomita, Tsukuba (JP); Shawna Liff, Scottsdale, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/123,215

(22) PCT Filed: May 28, 2014

(86) PCT No.: PCT/US2014/039834
§ 371 (c)(1),
(2) Date: Sep. 1, 2016

(87) PCT Pub. No.: WO2015/183264
PCT Pub. Date: Mar. 12, 2015

(65) Prior Publication Data
US 2017/0079135 A1 Mar. 16, 2017

(51) Int. Cl.
*H01L 23/538* (2006.01)
*H05K 1/02* (2006.01)
(Continued)

(52) U.S. Cl.
CPC ......... *H05K 1/0283* (2013.01); *H01L 21/486* (2013.01); *H01L 21/4853* (2013.01);
(Continued)

(58) Field of Classification Search
None
See application file for complete search history.

(56) References Cited

U.S. PATENT DOCUMENTS

| | | |
|---|---|---|
| 2004/0192082 A1 | 9/2004 | Wagner et al. |
| 2010/0002402 A1 | 1/2010 | Rogers et al. |

(Continued)

FOREIGN PATENT DOCUMENTS

JP    2011233822 A    11/2011

OTHER PUBLICATIONS

International Search Report and Written Opinion dated Feb. 25, 2015 for International Application No. PCT/US2014/039834, 11 pages.

(Continued)

*Primary Examiner* — Cheung Lee
(74) *Attorney, Agent, or Firm* — Schwabe, Williamson & Wyatt, P.C.

(57) ABSTRACT

Embodiments of the present disclosure describe a wavy interconnect for bendable and stretchable devices and associated techniques and configurations. In one embodiment, an interconnect assembly includes a flexible substrate defining a plane and a wavy interconnect disposed on the flexible substrate and configured to route electrical signals of an integrated circuit (IC) device in a first direction that is coplanar with the plane, the wavy interconnect having a wavy profile from a second direction that is perpendicular to the first direction and coplanar with the plane. Other embodiments may be described and/or claimed.

21 Claims, 7 Drawing Sheets

(51) Int. Cl.
*H01L 21/48* (2006.01)
*H01L 21/56* (2006.01)
*H01L 23/31* (2006.01)
*H01L 23/498* (2006.01)
*H01L 23/00* (2006.01)
*H05K 1/18* (2006.01)

(52) U.S. Cl.
CPC ........ *H01L 21/565* (2013.01); *H01L 23/3114* (2013.01); *H01L 23/4985* (2013.01); *H01L 23/49827* (2013.01); *H01L 23/49838* (2013.01); *H01L 23/49894* (2013.01); *H01L 23/5387* (2013.01); *H01L 23/5389* (2013.01); *H01L 24/16* (2013.01); *H01L 2224/16225* (2013.01); *H01L 2224/16227* (2013.01); *H01L 2924/1515* (2013.01); *H01L 2924/181* (2013.01); *H05K 1/185* (2013.01); *H05K 2201/10151* (2013.01)

(56) References Cited

U.S. PATENT DOCUMENTS

| | | |
|---|---|---|
| 2012/0176764 A1 | 7/2012 | Loher et al. |
| 2014/0022746 A1 | 1/2014 | Hsu |
| 2014/0097944 A1 | 4/2014 | Fastert et al. |
| 2014/0124257 A1 | 5/2014 | Yoshihara et al. |

OTHER PUBLICATIONS

Office Action dated Oct. 24, 2017 for Japanese Patent Application No. 2016-569605, 6 pages.
Office Action dated Nov. 13, 2017 for Korean Patent Application No. 2016-7030046, 20 pages.

US 9,942,980 B2

WAVY INTERCONNECT FOR BENDABLE AND STRETCHABLE DEVICES

CROSS REFERENCE TO RELATED APPLICATIONS

The present application is a national phase entry under 35 U.S.C. § 371 of International Application No. PCT/US2014/039834, filed May 28, 2014, entitled "WAVY INTERCONNECT FOR BENDABLE AND STRETCHABLE DEVICES", which designated, among the various States, the United States of America. The Specification of the PCT/US2014/039834 Application is hereby fully incorporated by reference.

FIELD

Embodiments of the present disclosure generally relate to the field of integrated circuit (IC) assemblies, and more particularly, to a wavy interconnect for bendable and stretchable devices and associated techniques and configurations.

BACKGROUND

Integrated circuit (IC) devices are being integrated in a variety of stretchable, bendable, flexible, and/or wearable devices. Interconnect density of electrical routing for such emerging devices is generally much smaller than an interconnect density for IC devices on more rigid substrates. For example, present interconnect density of stretchable devices may be in the range of about 1 input/output (I/O) connection per millimeter (mm) or even lower. Higher interconnect density may be desirable to reduce an area needed for routing of electrical signals to improve bandwidth with reduced form factor.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
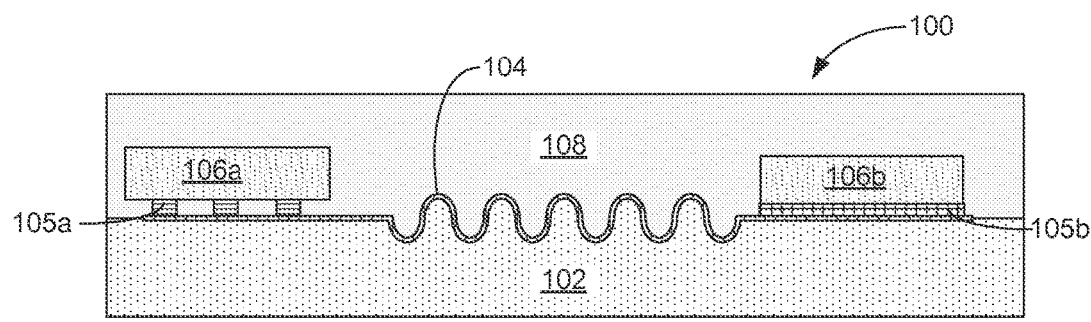
FIG. 1 schematically illustrates a cross-section side view of an example integrated circuit (IC) assembly, in accordance with some embodiments.

Embodiments of the present disclosure describe a wavy interconnect for bendable and stretchable devices and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100, in accordance with some embodiments. The IC assembly 100 may represent a stretchable and/or bendable IC assembly 100 in some embodiments. For example, in some embodiments, the IC assembly 100 may be a wearable device (e.g., an article wearable by a person). According to various embodiments, the IC assembly 100 includes a flexible substrate 102, one or more wavy interconnects (hereinafter "wavy interconnects 104"), one or more IC devices (e.g., IC devices 106a, 106b), and a passivation layer 108, as can be seen.

The flexible substrate 102 may be composed of a material that is configured to stretch and/or bend. For example, in some embodiments, the flexible substrate 102 may be composed of an elastic material. In some embodiments, the flexible substrate 102 is composed of an organic material (e.g., containing carbon) including a polymer such as, for example, polydimethylsiloxane (PDMS), polyethylene terephthalate (PET), rubber, silicones (e.g., platinum silicone), polyimide and the like. In other embodiments, the flexible substrate 102 may be composed of a non-organic material such as, for example, filler particles composed of silica or other non-organic material. The flexible substrate 102 may be composed of other suitable materials in other embodiments.

In some embodiments, the wavy interconnects 104 may be disposed on the flexible substrate 102. The wavy interconnects 104 may have a wavy profile, as can be seen, and may be configured to route electrical signals such as, for example, input/output (I/O) signals or power/ground, of one or more IC devices 106a, 106b. For example, in some embodiments, the wavy interconnects may route electrical signals between IC device 106a and 106b. The wavy interconnects 104 may be composed of an electrically conductive material such as, for example, a metal. In some embodiments, the wavy interconnects 104 may be composed of copper, nickel, gold, aluminum, silver, or combinations thereof and may be in the form of conductive ink, solder paste or other suitable form. The wavy interconnects 104 may be composed of other suitable materials in other embodiments.

Figure 2:
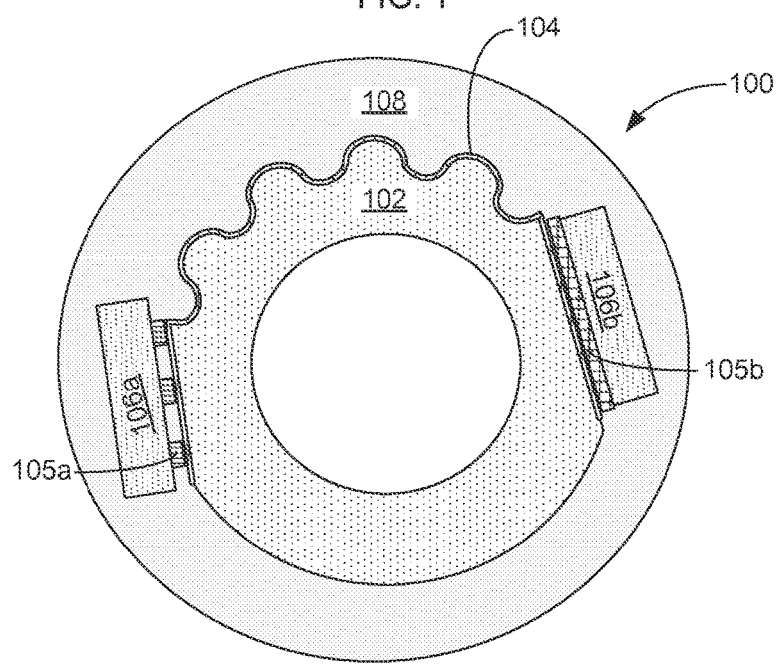
FIG. 2 schematically illustrates a cross-section side view of the example IC assembly of FIG. 1 in a bent configuration, in accordance with some embodiments.

The wavy profile of the wavy interconnects 104 may allow for a flexible range of motion of the IC assembly 100. For example, in some embodiments, the IC assembly may be stretched, bent or otherwise deformed. Referring briefly to FIG. 2, a cross-section side view of the example IC assembly 100 of FIG. 1 is depicted in a bent configuration, in accordance with some embodiments. In the depicted embodiment, the IC assembly 100 is bent to form an annular shape. The IC assembly 100 is not limited to the bent configuration and may be stretched and/or bent into a variety of suitable configurations to suit various purposes. For example, the IC assembly 100 may be stretched and/or bent to provide a shape that can be easily incorporated into an article for wearing by a person. In the depicted embodiment, ends of the IC assembly 100 may be coupled together using any suitable means to provide an annular shape that can be worn around a person's arm, leg, or neck. In other embodiments, the IC assembly 100 may be incorporated into articles of clothing, accessories or other products where the flexible nature of the IC assembly 100 may allow for bending or stretching of the IC assembly.

Referring to both FIGS. 1 and 2, one or more IC devices 106a and 106b may be electrically coupled with the wavy interconnects 104. In the depicted embodiment, the IC assembly 100 may represent a wavy interconnect board (WIB) assembly where the IC devices 106a and 106b are directly coupled with the flexible substrate. For example, the IC devices 106a and 106b may be mounted on the flexible substrate using surface mount technology (SMT). In the depicted embodiment, the IC device 106a may be coupled with electrical contacts (e.g., pads, traces—not shown) on the flexible substrate 102 that respectively correspond with the wavy interconnects 104 using one or more die interconnect structures 105a such as, for example, bumps, pillars, or analogous structure. The IC device 106a may be coupled with respective electrical contacts of the wavy interconnects 104 using a die connect film 105b such as, for example, anisotropic conductive film (ACF) or other conductive adhesive. The one or more IC devices 106a, 106b may be coupled with the flexible substrate 102 using other suitable techniques in other embodiments.

The IC devices 106a, 106b may represent any of a wide variety of suitable IC devices. For example, in some embodiments, either of the IC devices 106a, 106b may represent a die, package, sensor, socket, battery, passive device, communication interface or any other suitable device with integrated circuitry. The die or package may be, include, or be a part of a processor, memory, system-on-chip (SoC), or ASIC. In one embodiment, the IC device 106a may represent a die and the IC device 106b may represent any suitable type of sensor. The die may be configured to receive information from the sensor and perform actions based on the received information. In some embodiments, the one or more IC devices 106a, 106b may be rigid relative to the flexible substrate 102 and/or flexible passivation layer 108.

In some embodiments, a flexible passivation layer 108 may be formed on the flexible substrate 102, as can be seen. In some embodiments, the flexible passivation layer 108 may be disposed on the wavy interconnects 104 and/or the one or more IC devices 106a, 106b. The flexible passivation layer 108 may be, for example, a molding compound or other die encapsulant configured to at least partially or fully encapsulate the one or more IC devices 106a, 106b. The flexible passivation layer 108 may be composed of a wide variety of suitable materials including the materials described in connection with flexible substrate 102. In one embodiment, the flexible passivation layer 108 may have a same material composition as the flexible substrate 102.

Figure 3:
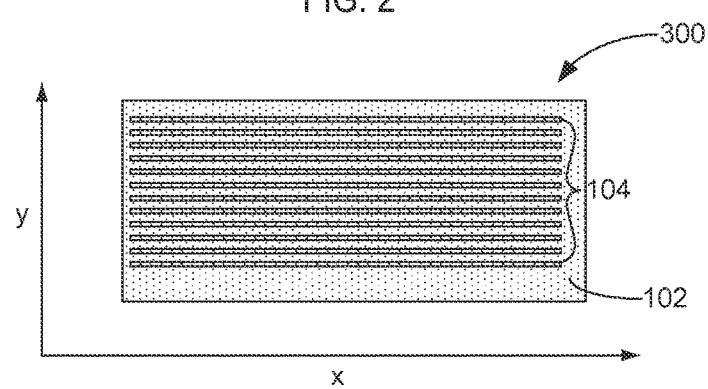
FIG. 3 schematically illustrates a cross-section top view of an interconnect assembly including wavy interconnects, in accordance with some embodiments.
Figure 4:
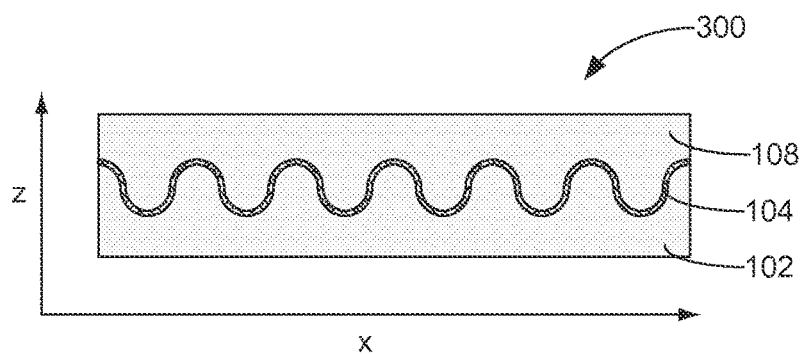
FIG. 4 schematically illustrates a cross-section side view of the interconnect assembly including wavy interconnects, in accordance with some embodiments.

FIG. 3 schematically illustrates a cross-section top view of an interconnect assembly 300 including wavy interconnects 104, in accordance with some embodiments, and FIG. 4 schematically illustrates a cross-section side view of the interconnect assembly 300 including wavy interconnects 104, in accordance with some embodiments. The wavy interconnects 104 may be disposed on a flexible substrate 102 and a flexible passivation layer 108 may be disposed on the wavy interconnects 104, as can be seen. The flexible substrate 102, wavy interconnects 104 and flexible passivation layer 108 may comport with embodiments described in connection with FIGS. 1-2 and vice versa. In some embodiments, the flexible substrate 102 may define a plane that may generally extend in the x-direction and y-direction, as can be seen in FIG. 3. In some embodiments, the wavy interconnects 104 may be configured to route electrical signals of an IC device (e.g., IC device 106a or 106b of FIGS. 1-2) in the x-direction, which may be coplanar with the plane. The wavy interconnects may run parallel to one another and may have a straight line profile when viewed from a direction (e.g., the z-direction of FIG. 4) that is perpendicular to the x-direction and y-direction, as can be seen in FIG. 3. In some embodiments, the wavy interconnects 104 may have a wavy profile when viewed from a direction (e.g., the y-direction of FIG. 3) that is perpendicular to the x-direction and coplanar with the plane defined by the flexible substrate 102, as can be seen in FIG. 4.

The configuration of the wavy profile of the wavy interconnects 104 as described in connection with FIGS. 3 and 4 may allow for higher interconnect density in an IC assembly (e.g., IC assembly 100 of FIG. 1) relative to an IC assembly having meander interconnects that have a wavy profile when viewed from the z-direction (e.g., when viewed from top view as in FIG. 3). For example, a meander interconnect of such meander interconnects may have a line width of about 100 microns and a meander width of about 1.5 mm to provide an interconnect density of about 1 I/O connection per mm On the other hand, in one embodiment, an individual wavy interconnect of the wavy interconnects 104 of the present disclosure may have a line width (e.g., in the y-direction) of about 10 microns and a space between adjacent wavy interconnects may be about 10 microns (e.g., about 20 micron pitch between adjacent way interconnects) to provide an interconnect density of about 50 I/O connections per mm. Thus, the wavy interconnects 104 of the present disclosure may increase interconnect density by a factor of about 50 times or greater relative to the meander interconnect for similar bending and/or stretching strength. The wavy interconnects 104 may have other suitable interconnect density in other embodiments including, for example, about 10 to 100 I/O connections per mm. In some embodiments, each of the wavy interconnects 104 may have a thickness (e.g., in the z-direction). In some embodiments, a ratio of the semi-amplitude to the thickness may be greater than or equal to 10.

The wavy profile of the wavy interconnects 104 may have a semi-amplitude (e.g., half of peak-to-peak amplitude). In some embodiments, a ratio of the semi-amplitude to the line width of the wavy interconnects 104 may be greater than 1:2 or ½. For a flexible substrate 102 having softer/more flexible materials (e.g., PDMS), the ratio of the semi-amplitude to the line width of the wavy interconnects 104 may be greater than 1:15 or 1/15 to effectively allow stretching and/or bending of the flexible substrate 102. An effectiveness of the wavy interconnects 104 to endure flexing such as stretching and/or bending without breaking may be based on the ratio of the semi-amplitude to the line width, while the thickness of the interconnect and the line width may be mostly irrelevant, according to some embodiments. However, for meander interconnects discussed above, an effectiveness to endure such flexing may be based on a ratio of the meander width to a line width of the meander interconnect. The wavy interconnects 104 may allow much higher interconnect density for at least the reason that processes for controlling film thickness may be more accurate than processes for controlling line width. For example, a wavy interconnect of wavy interconnects 104 may have a line width/space of 10 microns, a thickness of 1 micron and semi-amplitude of 50 microns while a meander interconnect may have a line width/space of 20 microns and meander width of 1 mm to provide similar stretching and/or bending resilience. In such case, the wavy interconnect provides an interconnect density that is about 50 times greater or more than the meander interconnect.

In some embodiments, the flexible substrate 102 and the wavy interconnects 104 may be configured to stretch in the x-direction and/or bend in the z-direction. The flexible substrate 102 and the wavy interconnects 104 may be configured to stretch and/or bend in other suitable directions in other embodiments.

In the depicted embodiment of FIG. 4, the wavy profile of the wavy interconnects 104 is a curved profile (e.g., having rounded edges). In other embodiments, the wavy profile may have other shapes including, for example, triangular, rectangular or irregular shapes. Curved wavy profiles may be preferable to wavy profiles having sharp corners because a stress concentration may coincide with a sharp corner, which may deform the flexible substrate 102.

FIGS. 5a-f schematically illustrate a cross-section side view of an example IC assembly 500 during various stages of fabrication, in accordance with some embodiments. In some embodiments, the techniques described in connection with FIGS. 5a-f may be used to form a WIB. According to various embodiments, the IC assembly 500 may comport with embodiments described in connection with IC assembly 100 of FIGS. 1-2 and vice versa.

Figure 5A:
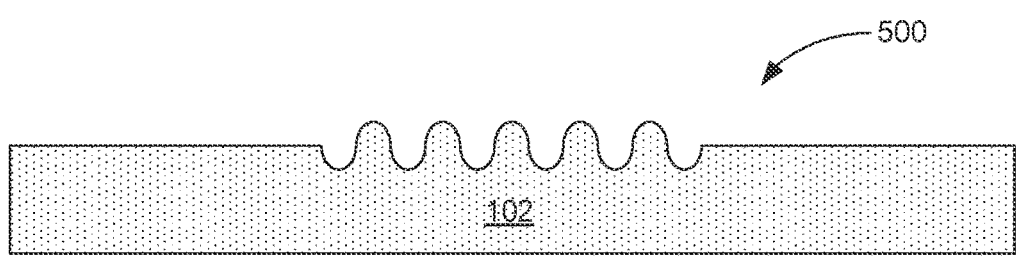
FIGS. 5a-f schematically illustrate a cross-section side view of an example IC assembly during various stages of fabrication, in accordance with some embodiments.

Referring to FIG. 5a, the IC assembly 500 is depicted subsequent to forming a wavy profile in a surface of a flexible substrate 102. The wavy profile may correspond with a wavy profile of a wavy interconnect to be formed on the wavy profile of the flexible substrate 102. The wavy profile may be formed according to a variety of suitable techniques including, for example, printing, molding or lithography process. The wavy profile may be formed using other suitable techniques in other embodiments.

Figure 5B:
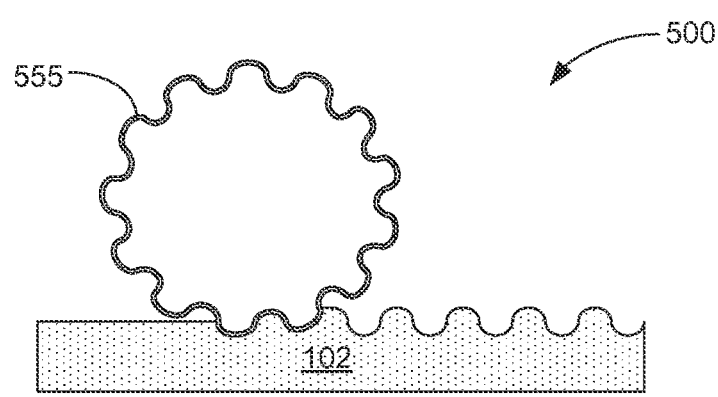

Referring to FIG. 5b, the IC assembly 500 is depicted during formation of the wavy profile in a surface of the flexible substrate 102 using a gravure printing process. In the gravure printing process, the flexible substrate 102 may be imprinted with the wavy profile pattern using a printing element 555 composed of a material that is harder than the material of the flexible substrate 102. The printing element 555 may roll over the surface of the flexible substrate 102 and form indentations corresponding with a pattern on the surface of the printing element 555 on the surface of the flexible substrate 102 to create the wavy profile. In some embodiments, the printing process is performed prior to curing the flexible substrate 102 to provide softer material for printing.

Figure 5C:
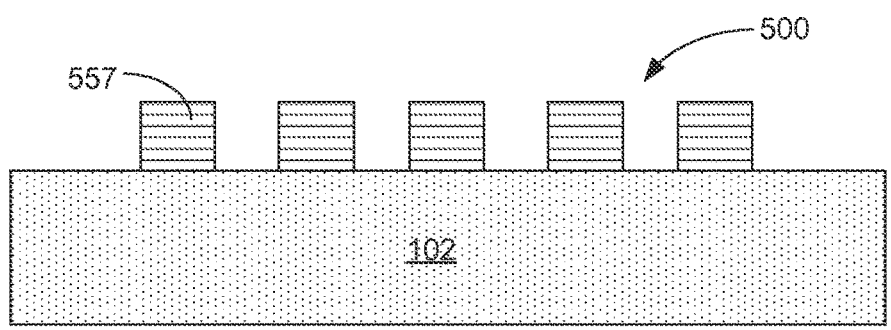

Referring to FIG. 5c, the IC assembly 500 is depicted during formation of the wavy profile in a surface of the flexible substrate 102 using a fuzzy lithography process. The fuzzy lithography process may include, for example, depositing and patterning a photodefinable material 557 on the flexible substrate 102. The photodefinable material 557 may be processed using grayscale lithography, partially phototransparent resist, low resolution photo-definable material, out of depth focus or other suitable technique to form the wavy profile in the flexible substrate 102.

Figure 5D:
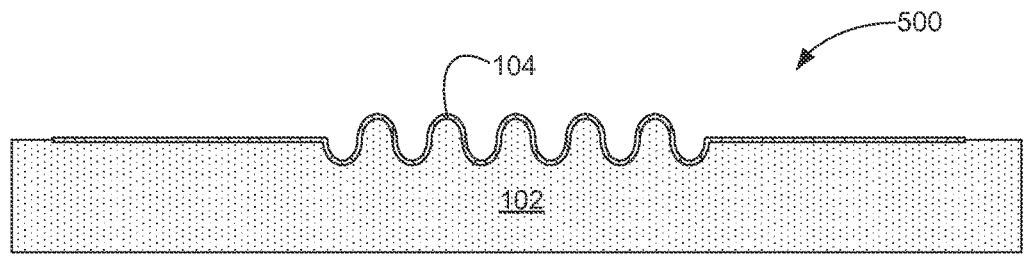

Referring to FIG. 5d, the IC assembly 500 is depicted subsequent to depositing a metal on the wavy profile to form one or more wavy interconnects 104. The metal may be deposited using any suitable process including, for example, additive or substractive processes. In some embodiments, the metal may be initially deposited as a single film and subsequently patterned to form discrete lines of the wavy interconnects 104.

Figure 5E:
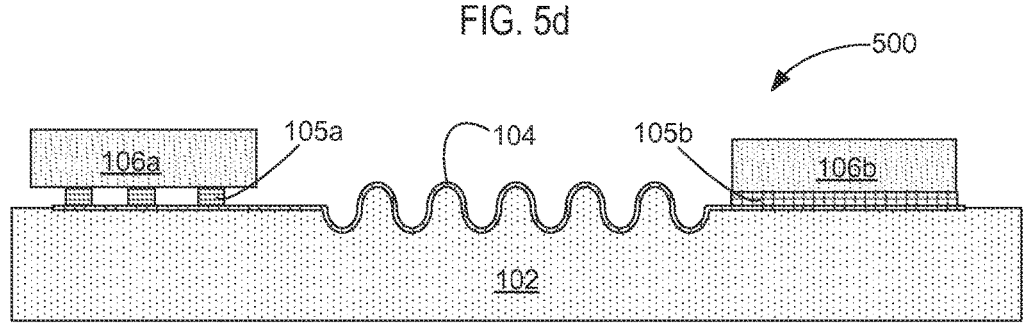

Referring to FIG. 5e, the IC assembly 500 is depicted subsequent to mounting one or more IC devices 106a, 106b on the flexible substrate 104. The IC devices 106a, 106b may be directly coupled with the flexible substrate 102 using SMT or other suitable mounting technique. In some embodiments, the IC device 106a may be coupled with the wavy interconnects 104 using die interconnect structures 105a such as, for example, bumps or pllars. In some embodiments, the IC device 106b may be coupled with the wavy interconnects 104 using ACF. The IC devices 106a, 106b may be coupled with the flexible substrate 102 using other suitable techniques in other embodiments.

Figure 5F:
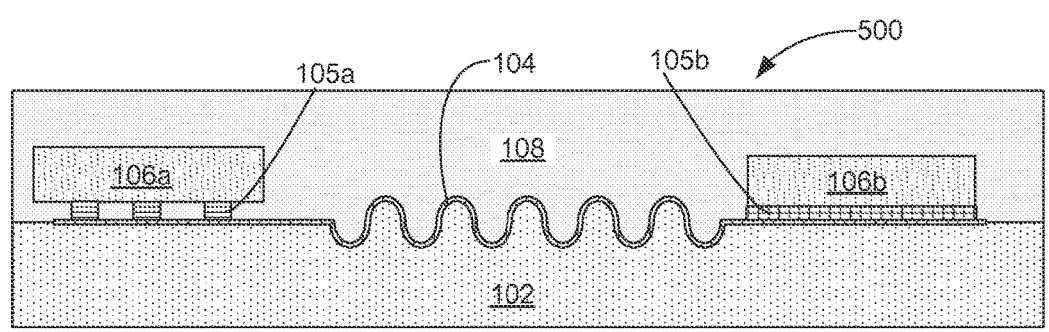

Referring to FIG. 5f, the IC assembly 500 is depicted subsequent to forming a flexible passivation layer 108 on the flexible substrate 104. In some embodiments, the flexible passivation layer 108 may be formed by depositing an electrically insulative material on the flexible substrate 102 to cover the wavy interconnects 104. In some embodiments, material of the flexible passivation layer 108 may be deposited to partially or fully encapsulate the IC devices 106a, 106b. The material of the flexible passivation layer 108 may be deposited using any suitable process including, for example, molding and/or lamination processes. The IC assembly 500 may be bent, stretched or otherwise flexed into another shape (e.g., bent configuration of FIG. 2).

Figure 6A:
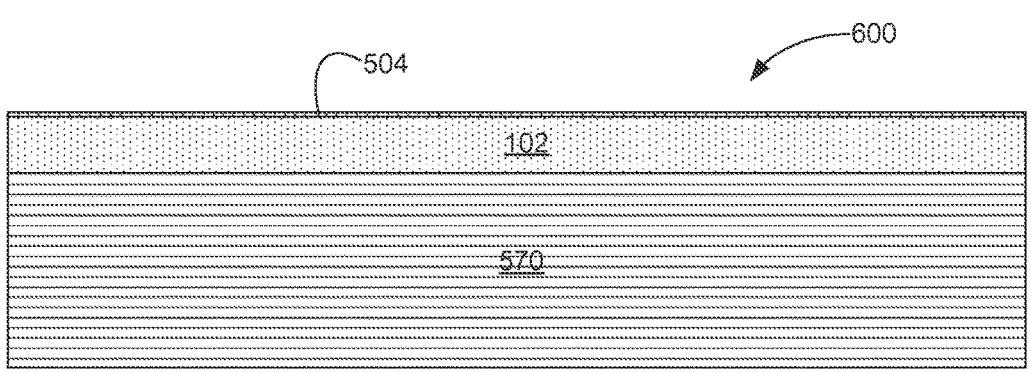
FIGS. 6a-c schematically illustrate a cross-section side view of an example IC assembly during various stages of fabrication, in accordance with some embodiments.
Figure 6B:
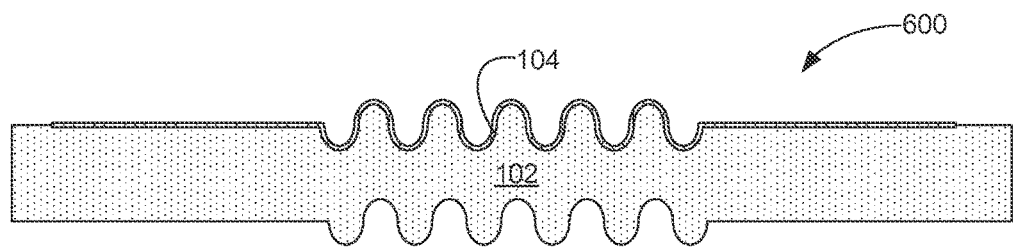
Figure 6C:
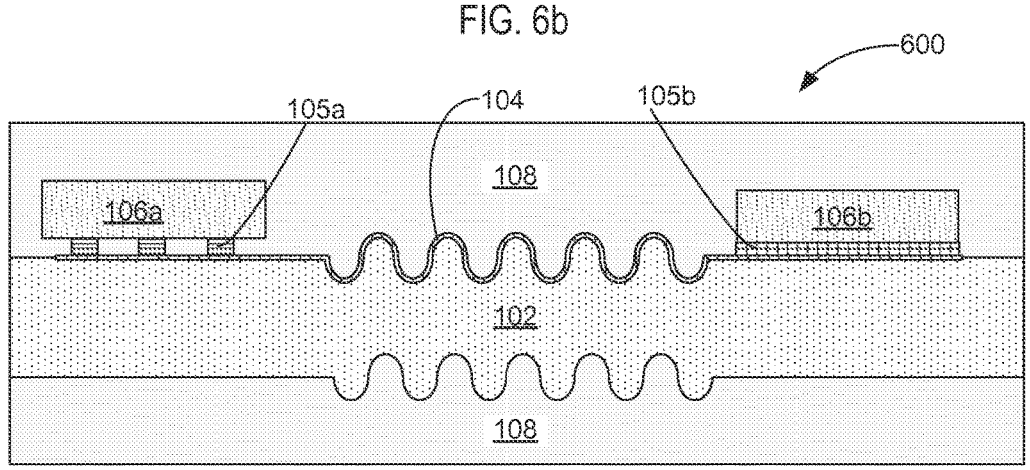

FIGS. 6a-c schematically illustrate a cross-section side view of an example IC assembly 600 during various stages of fabrication, in accordance with some embodiments. In some embodiments, the techniques described in connection with FIGS. 6a-c may be used to form a WIB. According to various embodiments, the IC assembly 600 may comport with embodiments described in connection with IC assembly 100 of FIGS. 1-2 and vice versa.

Referring to FIG. 6a, the IC assembly 600 is depicted subsequent to forming routing lines 504 of wavy interconnects on a flexible substrate 102. In some embodiments, the flexible substrate 102 may be temporarily coupled with a carrier 570 and have a surface facing away from the carrier 570 that is substantially flat, as can be seen. The flexible substrate 102 may be coupled with the carrier 570 prior to deposition of the metal. In some embodiments, the metal may be blanket deposited as a film to provide a metal layer that is subsequently patterned using, for example, etch and/or lithography processes to form routing lines 504 of the wavy interconnects. In other embodiments, the metal may be selectively deposited (e.g., ink printing process) to form the routing lines 504 of wavy interconnects.

Referring to FIG. 6b, the IC assembly 600 is depicted subsequent to decoupling the carrier 570 from the flexible substrate 102 and shaping the metal and the flexible substrate 102 to create wavy interconnects 104 having a wavy profile. In some embodiments, the flexible substrate 102 may be released from the carrier 570 and, subsequently, the metal of the routing lines 504 and the flexible substrate 102 may be shaped using, for example, a pressing or chemical process to locally deform the metal and flexible substrate 102. In some embodiments, the shaping process may cause a wavy profile to be formed on opposing sides of the flexible substrate 102, as can be seen.

Referring to FIG. 6c, the IC assembly 600 is depicted subsequent to mounting IC devices 106a, 106b on the flexible substrate 102 and forming a flexible passivation layer 108 on the flexible substrate 102. The IC devices 106a, 106b may be mounted according to techniques described in connection with FIG. 5e. In some embodiments, the flexible passivation layer 108 may be formed on opposing sides of the flexible substrate 102 to lock in the wavy profile of the wavy interconnects 104, as can be seen.

Figure 7:
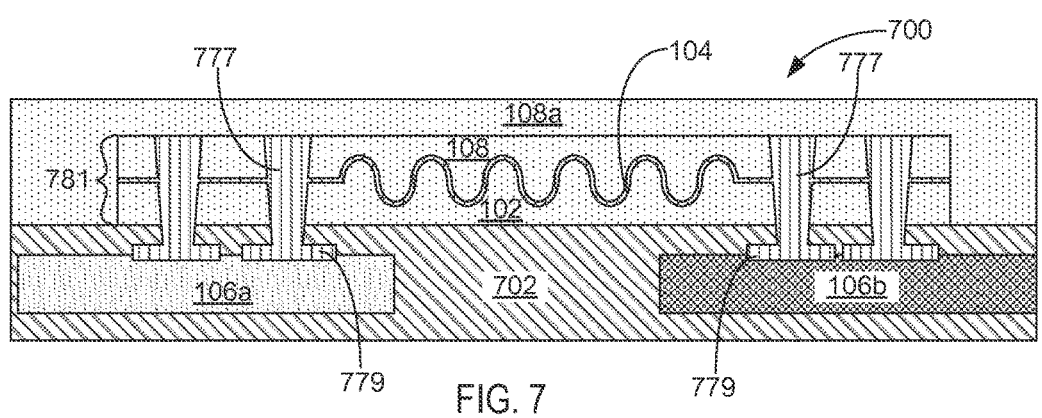
FIG. 7 schematically illustrates a cross-section side view of another example IC assembly, in accordance with some embodiments.

FIG. 7 schematically illustrates a cross-section side view of another example IC assembly 700, in accordance with some embodiments. According to various embodiments, the IC assembly 700 may be configured in a wavy interconnect module (WIM) configuration.

In some embodiments, the wavy interconnects 104 may be embedded in a module 781 including a flexible substrate 102 and passivation layer 108. In some embodiments, the module 781 may only include the flexible substrate and the wavy interconnects 104. For example, the flexible passivation layer 108a may be deposited on the wavy interconnects 104 in some embodiments.

The wavy interconnects 104 may be electrically coupled with IC devices 106a, 106b embedded in another flexible substrate 702 using one or more through-substrate interconnects 777 such as, for example, plated-through holes (PTHs) or vias, as can be seen. In some embodiments, the through-substrate interconnects 777 may extend through at least a portion of the flexible substrates 102 and 702, as can be seen.

Each of the wavy interconnects 104 may be electrically coupled with a corresponding pad of pads 779 formed on the IC devices 106a, 106b. In some embodiments, another flexible passivation layer 108a may be formed to encapsulate the module 781 including the wavy interconnects 104, as can be seen. The flexible substrate 702 and/or the passivation layer 108a may comport with embodiments respectively described in connection with flexible substrate 102 and/or the passivation layer 108.

FIGS. 8a-f schematically illustrate a cross-section side view of the example IC assembly 700 of FIG. 7 during various stages of fabrication, in accordance with some embodiments. According to various embodiments, the IC assembly 700 may comport with embodiments described in connection with FIG. 7 and vice versa.

Figure 8A:
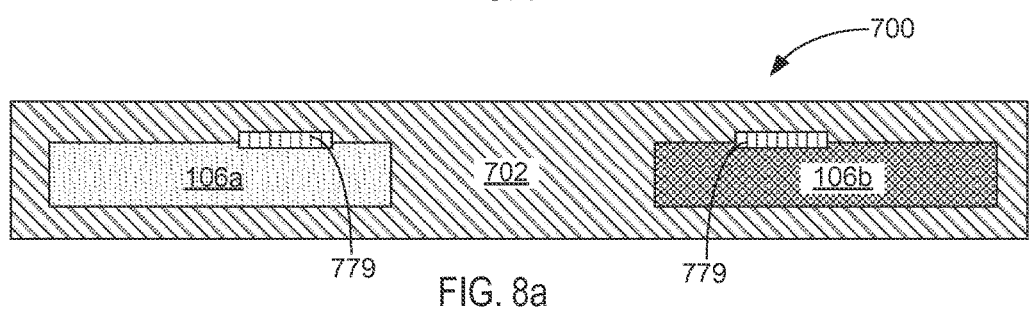
FIGS. 8a-f schematically illustrate a cross-section side view of the example IC assembly of FIG. 7 during various stages of fabrication, in accordance with some embodiments.

Referring to FIG. 8a, the IC assembly 700 is depicted subsequent to embedding the IC devices 106a, 106b in a flexible substrate 702. The IC devices 106a, 106b may be embedded using any of a wide variety of suitable techniques including, for example, build-up lamination processes. Pads 779 may be formed on the IC devices 106a, 106b prior to being embedded in some embodiments.

Figure 8B:
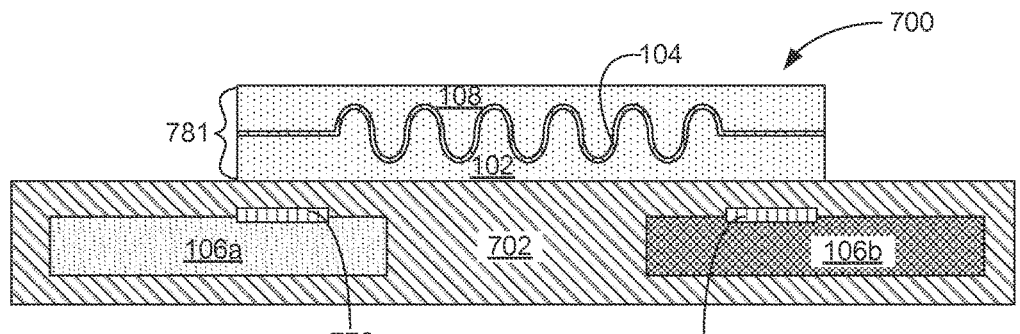

Referring to FIG. 8b, the IC assembly 700 is depicted subsequent to coupling a module 781 including the wavy interconnects 104 with the flexible substrate 702. The module 781 may be formed by performing actions described in connection with FIGS. 5a-d. In some embodiments, a passivation layer (e.g., flexible passivation layer 108 of FIG. 5f) may be deposited on the IC assembly 500 of FIG. 5d to form the module 781.

The module 781 may be coupled with the flexible substrate 702 using any suitable technique including, for example, lamination or using an adhesive. In some embodiments, the module 781 may be aligned with the flexible substrate 702 prior to coupling the module 781 with the flexible substrate 702, using any suitable alignment technique.

Figure 8C:
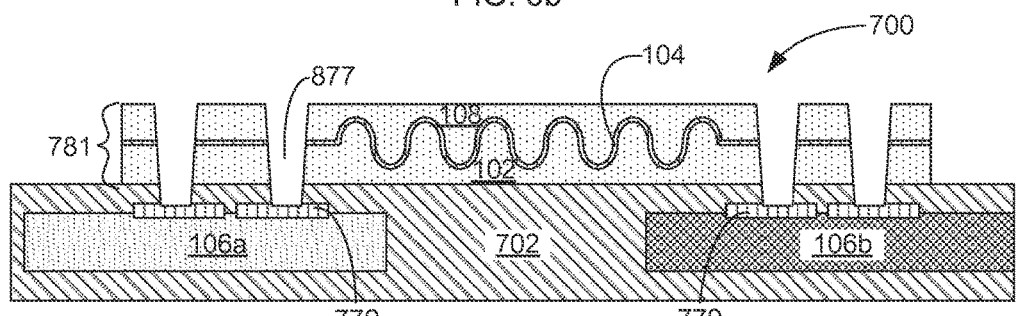

Referring to FIG. 8c, the IC assembly 700 is depicted subsequent to forming openings 877 corresponding with through-substrate interconnects to be formed through the module 781. In some embodiments, one or more of the pads 779 may be sized to be larger than alignment uncertainty between the module 781 and the flexible substrate 702 to facilitate alignment and formation of the through-substrate interconnects. The openings 877 may be formed using any suitable technique including, for example, patterning and etching or drilling such as laser drilling. In some embodiments adjacent pads 779 may be positioned at a pitch of about 300 microns or less.

Figure 8D:
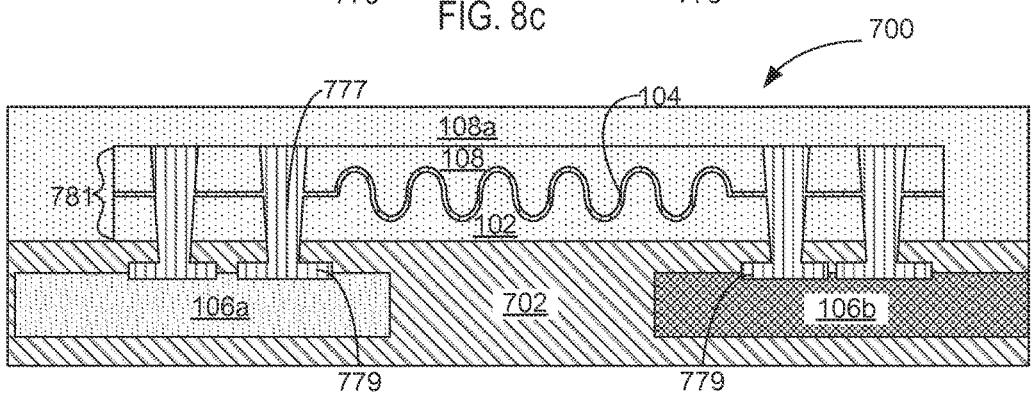

Referring to FIG. 8d, the IC assembly 700 is depicted subsequent to depositing metal in the openings 877 to form through-substrate interconnects 777 that electrically couple the wavy interconnects 104 with the IC devices 106a, 106b and depositing a flexible passivation layer 108a on the module 781, as can be seen. In some embodiments, the metal may be deposited to substantially fill the openings 877 to form the through-substrate interconnects 777. In other embodiments, the metal may be deposited to partially fill the openings 877. The through-substrate interconnects 777 may be formed using other techniques described in connection with FIGS. 8e-f in other embodiments.

Figure 8E:
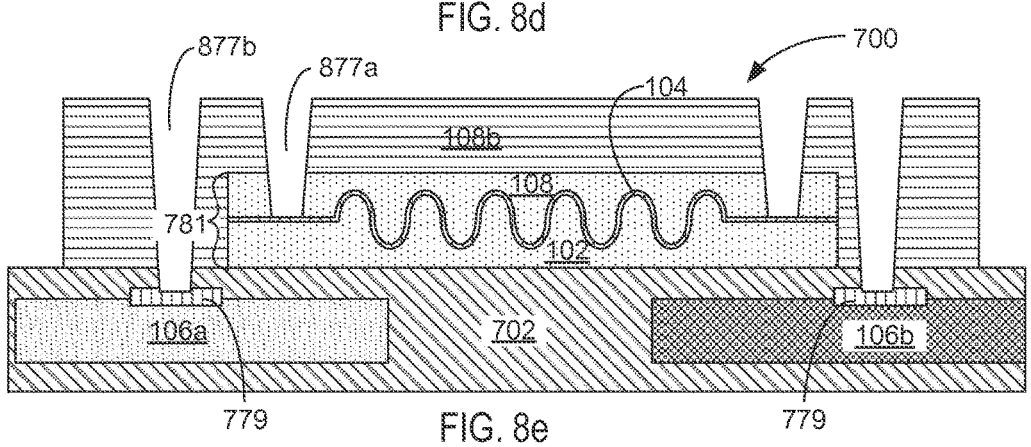

Referring to FIG. 8e, the IC assembly 700 is depicted subsequent to forming openings 877a, 877b using another technique to provide higher density electrical routing. For example, in FIG. 8e, formation of the openings 877a, 877b may be facilitated using a pre-mapped pad location in either the module 781 and/or on a surface of the IC devices 106a, 106b embedded in the flexible substrate 702. A masking layer 108b may be formed on the module 781 and flexible substrate 702. In some embodiments, one or more openings 877a may be formed through masking layer 108b and flexible passivation layer 108 of the module 781 to expose a wavy interconnect of the wavy interconnects 104. One or more openings 877b may be formed through the masking layer 108b to expose one or more corresponding pads 779 on IC devices 106a, 106b. In some embodiments, the masking layer 108b may be composed of a flexible material. For example, the masking layer 108b may comport with embodiments described in connection with flexible substrate 102 and/or flexible passivation layer 108 in some embodiments.

Figure 8F:
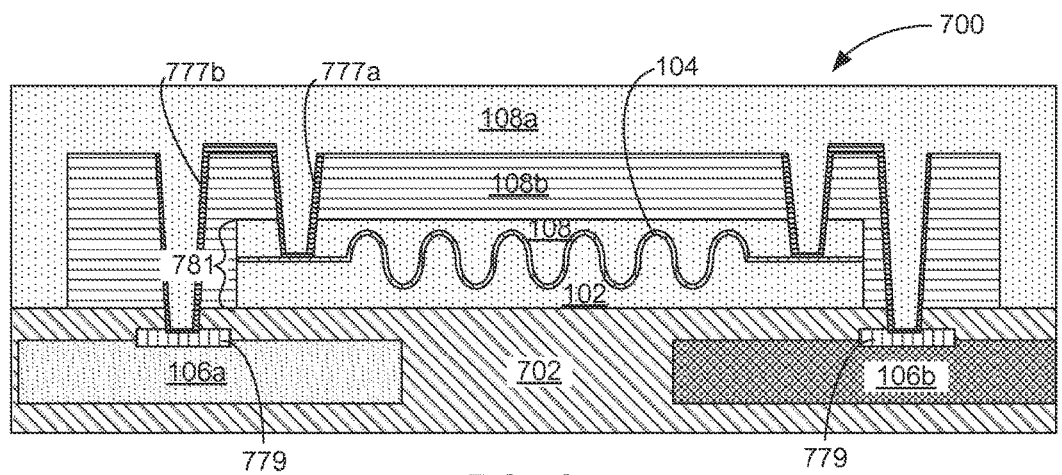

Referring to FIG. 8f, the IC assembly 700 is depicted subsequent to depositing metal in the openings 877a, 877b of FIG. 8e to form through-substrate interconnects 777a, 777b that electrically couple the wavy interconnects 104 with the IC devices 106a, 106b and depositing a flexible passivation layer 108a on the masking layer 108b, as can be seen. In some embodiments, the metal may be deposited to only partially fill the openings 877a, 877b of FIG. 8e to form the through-substrate interconnects 777a, 777b. For example, the metal may line the openings 877a, 877b, and provide routing between through-substrate interconnect 777a and through-substrate interconnect 777b, as can be seen. In other embodiments, the metal may be deposited to fill the openings 877. Direct laser imaging (DLI) may be used to pattern the routing from through-substrate interconnects 777 on the IC devices 106a, 106b (e.g., corresponding with openings 877b) to the through-substrate interconnects 777 on the module 781 (e.g., corresponding with openings 877a). In some embodiments, the material of the flexible passivation layer 108a may partially fill the openings 877a, 877b, as can be seen.

Figure 9:
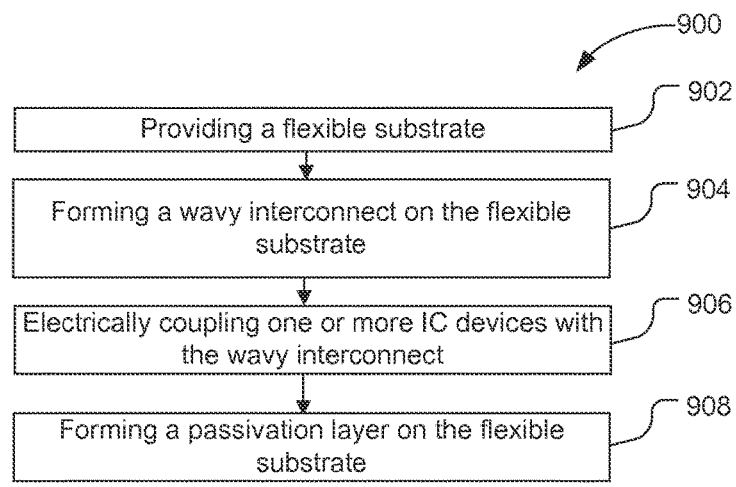
FIG. 9 schematically illustrates a flow diagram for a method of fabricating an IC assembly, in accordance with some embodiments.

FIG. 9 schematically illustrates a flow diagram for a method 900 of fabricating an IC assembly (e.g., IC assembly 100 of FIGS. 1-2 or IC assembly 700 of FIG. 7), in accordance with some embodiments. Actions of the method 900 may comport with techniques described in connection with FIGS. 1-8. At 902, the method 900 may include providing a flexible substrate (e.g., flexible substrate 102 of FIG. 5c). According to various embodiments, the flexible substrate may define a plane.

At 904, the method 900 may include forming a wavy interconnect (e.g., wavy interconnects 104 of FIG. 5d or FIG. 6b) on the flexible substrate. According to various embodiments, the wavy interconnect may be configured to route electrical signals of an IC device in a first direction that is coplanar with the plane defined by the flexible substrate. The wavy interconnect may have a wavy profile when viewed from a second direction that is perpendicular to the first direction and coplanar with the plane.

In some embodiments, forming the wavy interconnect may include forming a wavy profile in a surface of the flexible substrate (e.g., as described and/or depicted in connection with FIGS. 5a-c) and subsequently depositing a metal on the wavy profile (e.g., as described and/or depicted in connection with FIG. 5d). In some embodiments, a printing, molding or lithography process may be used to form the wavy profile. In other embodiments, forming the wavy interconnect may include depositing a metal on a substantially flat surface of the flexible substrate (e.g., as described and/or depicted in connection with FIG. 6a) and, subsequently, shaping the metal and the flexible substrate to create the wavy profile (e.g., as described and/or depicted in connection with FIG. 6b).

At 906, the method 900 may include electrically coupling one or more IC devices (e.g., IC devices 106a, 106b of FIGS. 1-2 and 7) with the wavy interconnect. In some embodiments, the one or more IC devices may be mounted on the flexible substrate by coupling the one or more IC devices with the wavy interconnect using, for example, SMT such as forming solder joints and the like (e.g., as described and/or depicted in connection with FIG. 5e or 6c). In other embodiments, the one or more IC devices may be embedded in another flexible substrate (e.g., flexible substrate 702 of FIG. 8a), which may be coupled with the flexible substrate of the wavy interconnect. An electrical connection may be formed between the wavy interconnect and the embedded one or more IC devices. In some embodiments, the electrical connection may be a through-substrate interconnect (e.g., through-substrate interconnect 777 of FIG. 8d or through-substrate interconnects 777a, 777b of FIG. 8f). In a case where two or more IC devices are coupled with the wavy interconnects, the wavy interconnects may be configured to route electrical signals between two or more of the IC devices.

At 908, the method 900 may include forming a passivation layer on the flexible substrate. The passivation layer (e.g., flexible passivation layer 108 of FIG. 5f) may be deposited to cover the wavy interconnect, in some embodiments. In some embodiments, the passivation layer may be deposited subsequent to mounting the one or more IC devices on the flexible substrate such that the passivation layer is deposited on the one or more IC devices when deposited on the flexible substrate (e.g., as described and/or depicted in connection with FIG. 5f). In some embodiments, the passivation layer may be deposited on opposing sides of the flexible substrate to lock in the wavy profile (e.g., as described and/or depicted in connection with FIG. 6c). In some embodiments, the passivation layer may be deposited on the wavy interconnect to form a module (e.g., module 781 of FIG. 8b). In some embodiments, a passivation layer (e.g., passivation layer 108a of FIG. 8d or 8f) may be deposited to encapsulate the module.

Various operations are described as multiple discrete operations in turn, in a manner that is most helpful in understanding the claimed subject matter. However, the order of description should not be construed as to imply that these operations are necessarily order dependent.

Figure 10:
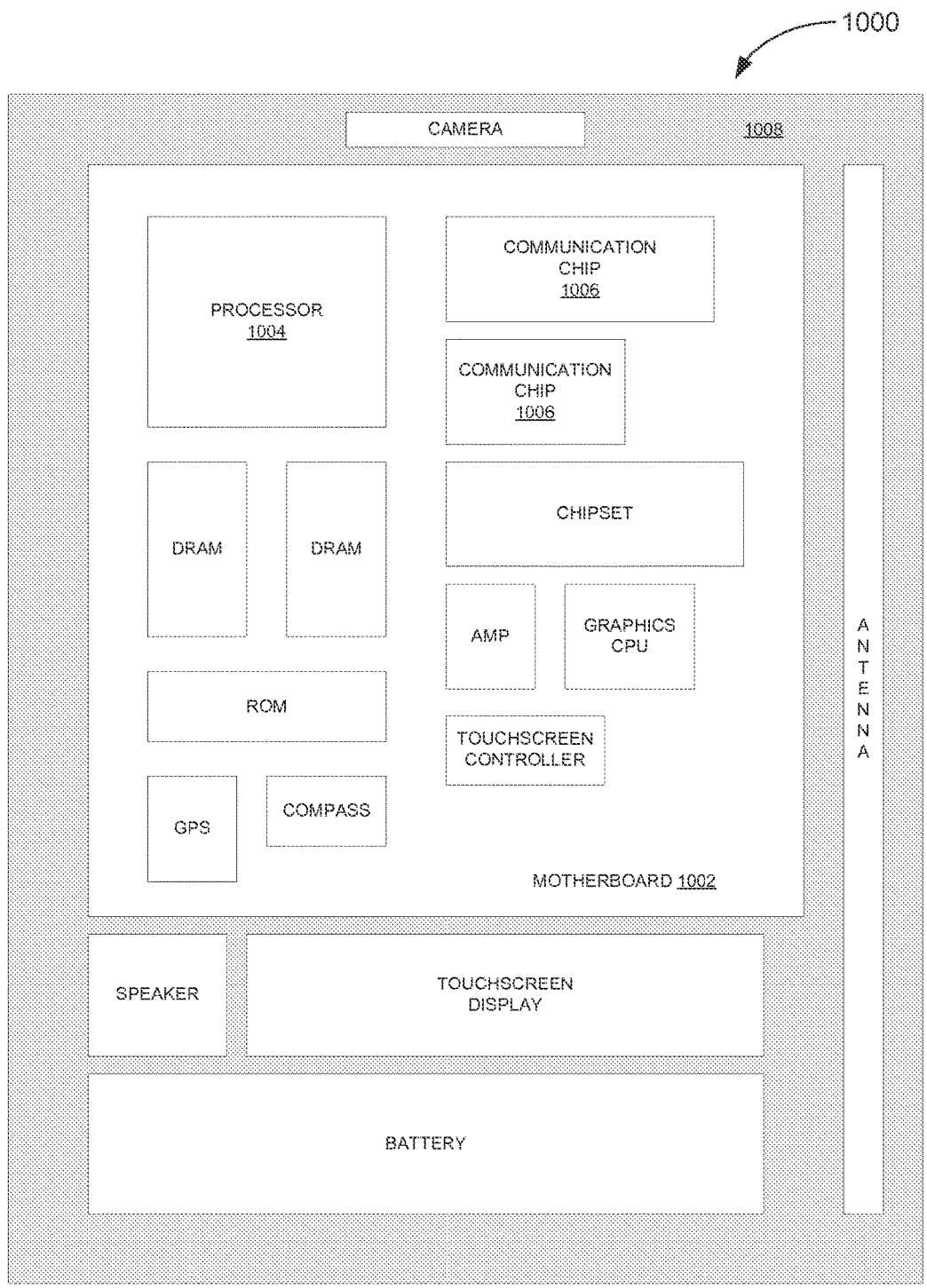
FIG. 10 schematically illustrates an example computing device that includes an IC assembly having wavy interconnects as described herein, in accordance with some embodiments.

Embodiments of the present disclosure may be implemented into a system using any suitable hardware and/or software to configure as desired. FIG. 10 schematically illustrates an example computing device that includes an IC assembly (e.g., IC assembly 100 of FIGS. 1-2 or IC assembly 700 of FIG. 7) having wavy interconnects (e.g., wavy interconnects 104 of FIGS. 1-2 or FIG. 7) as described herein, in accordance with some embodiments. The computing device 1000 may house a board such as motherboard 1002 (e.g., in housing 1008). The motherboard and/or housing may include flexible materials to allow stretching and/or bending of the computing device, in some embodiments. The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, EV-DO, and others.

The processor 1004 of the computing device 1000 may be packaged in an IC assembly (e.g., IC assembly 100 of FIGS. 1-2 or IC assembly 700 of FIG. 7) having wavy interconnects (e.g., wavy interconnects 104 of FIGS. 1-2 or FIG. 7) as described herein. For example, the motherboard 1002 may be coupled with or be part of a flexible substrate (e.g., flexible substrate 102 of FIGS. 1-2 or flexible substrate 702 of FIG. 7) and the processor 1004 or any other IC device (e.g., communication chip 1006, memory device, compass, etc.) may be the one or more IC devices (e.g., IC devices 106a, 106b) as described herein. Other suitable configurations may be implemented in accordance with embodiments described herein. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 1000 may be a flexible mobile computing device in some embodiments. In some embodiments, the flexible IC assembly of the computing device may be wearable by a person (e.g., incorporated in an article of clothing or an accessory). In further implementations, the computing device 1000 may be any other electronic device that processes data.

EXAMPLES

According to various embodiments, the present disclosure describes an apparatus (e.g., interconnect assembly). Example 1 of an interconnect assembly includes a flexible substrate defining a plane and a wavy interconnect disposed on the flexible substrate and configured to route electrical signals of an integrated circuit (IC) device in a first direction that is coplanar with the plane, the wavy interconnect having a wavy profile from a second direction that is perpendicular to the first direction and coplanar with the plane. Example 2 may include the interconnect assembly of Example 1, wherein the wavy interconnect has a straight line profile from a third direction that is perpendicular to the first direction and the second direction. Example 3 may include the interconnect assembly of Example 1, wherein the flexible substrate and the wavy interconnect are configured to stretch in the first direction and/or bend in a third direction that is perpendicular to the first direction and the second direction. Example 4 may include the interconnect assembly of Example 1, wherein the wavy interconnect has a width in the second direction, the wavy profile has a semi-amplitude, and a ratio of the width to the semi-amplitude (width/semi-amplitude) is greater than or equal to ½. Example 5 may include the interconnect assembly of Example 4, wherein the wavy interconnect has a thickness in a third direction that is perpendicular to the first direction and the second direction and a ratio of the semi-amplitude to the thickness (semi-amplitude/thickness) is greater than or equal to 10. Example 6 may include the interconnect assembly of any of Examples 1-5, wherein the wavy profile is a curved profile. Example 7 may include the interconnect assembly of any of Examples 1-5, wherein the wavy interconnect is one of multiple wavy interconnects that run parallel with the wavy interconnect in the first direction. Example 8 may include the interconnect assembly of any of Examples 1-5, wherein the wavy interconnect comprises a metal and the flexible substrate comprises a polymer.

According to various embodiments, the present disclosure describes a method of fabricating an IC assembly. Example 9 of a method may include providing a flexible substrate, the flexible substrate defining a plane and forming a wavy interconnect on the flexible substrate, the wavy interconnect being configured to route electrical signals of an integrated circuit (IC) device in a first direction that is coplanar with the plane, the wavy interconnect having a wavy profile from a second direction that is perpendicular to the first direction and coplanar with the plane. Example 10 may include the method of Example 9, wherein forming the wavy interconnect comprises forming a wavy profile in a surface of the flexible substrate and depositing a metal on the wavy profile. Example 11 may include the method of Example 10, wherein forming the wavy profile comprises using a printing, molding or lithography process. Example 12 may include the method of Example 9, further comprising depositing a passivation layer on the flexible substrate to cover the wavy interconnect. Example 13 may include the method of Example 12, further comprising electrically coupling the IC device with the wavy interconnect prior to depositing the passivation layer, wherein depositing the passivation layer comprises depositing the passivation layer on the IC device. Example 14 may include the method of Example 9, wherein forming the wavy interconnect comprises depositing a metal on a substantially flat surface of the flexible substrate and shaping the metal and the flexible substrate to create the wavy profile. Example 15 may include the method of Example 14, wherein the metal is deposited on a first side of the flexible substrate that is disposed opposite to a second side of the flexible substrate, the method further comprising mounting the IC device on the flexible substrate and depositing a flexible passivation layer on the first side and the second side of the flexible substrate to lock in the wavy profile. Example 16 may include the method of Example 9, wherein the flexible substrate is a first flexible substrate, the method further comprising embedding the IC device in a second flexible substrate, coupling the first substrate with the second substrate, and forming an electrical connection between the wavy interconnect and the IC device. Example 17 may include the method of Example 16, wherein forming the electrical connection comprises forming a through-substrate interconnect.

According to various embodiments, the present disclosure describes a stretchable or bendable integrated circuit (IC) assembly. Example 18 of a stretchable or bendable IC assembly includes an integrated circuit (IC) device a flexible substrate defining a plane and a wavy interconnect disposed on the flexible substrate and electrically coupled with the IC device to route electrical signals of the IC device in a first direction that is coplanar with the plane, the wavy interconnect having a wavy profile from a second direction that is perpendicular to the first direction and coplanar with the plane. Example 19 may include the IC assembly of Example 18, wherein the wavy interconnect has a straight line profile from a third direction that is perpendicular to the first direction and the second direction. Example 20 may include the IC assembly of Example 18, wherein the IC device is a first IC device, the IC assembly further comprising a second IC device electrically coupled with the wavy interconnect, wherein the wavy interconnect is configured to route electrical signals between the first IC device and the second IC device. Example 21 may include the IC assembly of Example 20, wherein the first IC device is a die and the second IC device is a sensor. Example 22 may include the IC assembly of Example 18, wherein the IC device is directly coupled with the flexible substrate, the IC assembly further comprising a flexible passivation layer disposed on the wavy interconnect and the IC device. Example 23 may include the IC assembly of Example 22, wherein the wavy interconnect is disposed on a first side of the flexible substrate, a second side of the flexible substrate has a wavy profile corresponding with the wavy profile of the wavy interconnect, and the second side is disposed opposite to the first side. Example 24 may include the IC assembly of Example 18, wherein the flexible substrate is a first flexible substrate, the IC device is embedded in a second flexible substrate that is coupled with the first flexible substrate, and the IC device is electrically coupled with the wavy interconnect using a through-substrate interconnect that extends through at least a portion of the first flexible substrate and the second flexible substrate. Example 25 may include the IC assembly of any of Examples 18-24, wherein the IC assembly is wearable by a person.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An interconnect assembly comprising:
   a flexible substrate defining a plane; and
   a wavy interconnect disposed on the flexible substrate and configured to route electrical signals of an integrated circuit (IC) device in a first direction that is coplanar with the plane, the wavy interconnect having a wavy profile when viewed from a second direction that is perpendicular to the first direction and coplanar with the plane;
   wherein:
   the wavy interconnect is disposed on a first side of the flexible substrate;
   a second side of the flexible substrate has a wavy profile corresponding with the wavy profile of the wavy interconnect and
   the second side is disposed opposite to the first side.

2. The interconnect assembly of claim 1, wherein the wavy interconnect has a straight line profile when viewed from a third direction that is perpendicular to the first direction and the second direction.

3. The interconnect assembly of claim 1, wherein the flexible substrate and the wavy interconnect are configured to stretch in the first direction, bend around an axis of the second direction and/or twist out of a plane defined by the first direction and the second direction.

4. The interconnect assembly of claim 1, wherein:
   the wavy profile has a semi-amplitude;
   the wavy interconnect has a thickness in a third direction that is perpendicular to the first direction and the second direction; and
   a ratio of the semi-amplitude to the thickness (semi-amplitude/thickness) is greater than or equal to 10.

5. The interconnect assembly of claim 1, wherein:
   the wavy interconnect has a width in the second direction;
   the wavy interconnect is one of a plurality of wavy interconnects having a pitch between adjacent wavy interconnects in the second direction; and
   a ratio of the width to the pitch (width/pitch) is greater than or equal to ½.

6. The interconnect assembly of claim 1, wherein the wavy profile is a curved profile.

7. The interconnect assembly of claim 1, wherein the wavy interconnect is one of multiple wavy interconnects that run parallel with the wavy interconnect in the first direction.

8. The interconnect assembly of claim 1, wherein:
   the wavy interconnect comprises a metal; and
   the flexible substrate comprises a polymer.

9. A method of fabricating an integrated circuit (IC) assembly, the method comprising:
   providing a flexible substrate, the flexible substrate defining a plane; and
   forming a wavy interconnect on the flexible substrate, the wavy interconnect being configured to route electrical signals of an integrated circuit (IC) device in a first direction that is coplanar with the plane, the wavy interconnect having a wavy profile when viewed from a second direction that is perpendicular to the first direction and coplanar with the plane;
   wherein forming the wavy interconnect comprises:
   depositing a metal on a substantially flat surface of the flexible substrate; and
   shaping the metal and the flexible substrate to create the wavy profile.

10. The method of claim 9, further comprising:
    depositing a passivation layer on the flexible substrate to cover the wavy interconnect.

11. The method of claim 10, further comprising:
    electrically coupling the IC device with the wavy interconnect prior to depositing the passivation layer, wherein depositing the passivation layer comprises depositing the passivation layer on the IC device.

12. The method of claim 9, wherein the metal is deposited on a first side of the flexible substrate that is disposed opposite to a second side of the flexible substrate, the method further comprising:
    mounting the IC device on the flexible substrate; and
    depositing a flexible passivation layer on the first side and the second side of the flexible substrate to lock in the wavy profile.

13. The method of claim 9, wherein the flexible substrate is a first flexible substrate, the method further comprising:
    embedding the IC device in a second flexible substrate;
    coupling the first substrate with the second substrate; and
    forming an electrical connection between the wavy interconnect and the IC device.

14. The method of claim 13, wherein forming the electrical connection comprises forming a through-substrate interconnect.

15. A stretchable or bendable integrated circuit (IC) assembly, the IC assembly comprising:
    an integrated circuit (IC) device;
    a flexible substrate defining a plane; and
    a wavy interconnect disposed on the flexible substrate and electrically coupled with the IC device to route electrical signals of the IC device in a first direction that is coplanar with the plane, the wavy interconnect having a wavy profile when viewed from a second direction that is perpendicular to the first direction and coplanar with the plane;
    wherein:
    the flexible substrate is a first flexible substrate;
    the IC device is embedded in a second flexible substrate that is coupled with the first flexible substrate; and
    the IC device is electrically coupled with the wavy interconnect using a through-substrate interconnect that extends through at least a portion of the first flexible substrate and the second flexible substrate.

16. The IC assembly of claim 15, wherein the wavy interconnect has a straight line profile when viewed from a third direction that is perpendicular to the first direction and the second direction.

17. The IC assembly of claim 15, wherein the IC device is a first IC device, the IC assembly further comprising:
    a second IC device electrically coupled with the wavy interconnect, wherein the wavy interconnect is configured to route electrical signals between the first IC device and the second IC device.

18. The IC assembly of claim 17, wherein the first IC device is a die and the second IC device is a sensor.

19. The IC assembly of claim 15, wherein the IC device is directly coupled with the flexible substrate, the IC assembly further comprising:
    a flexible passivation layer disposed on the wavy interconnect and the IC device.

20. The IC assembly of claim 19, wherein:
    the wavy interconnect is disposed on a first side of the flexible substrate;
    a second side of the flexible substrate has a wavy profile corresponding with the wavy profile of the wavy interconnect; and
    the second side is disposed opposite to the first side.

21. The IC assembly of claim 15, wherein the IC assembly is wearable by a person.

\* \* \* \* \*